United States Patent [19]
Kaji et al.

[11] Patent Number: 5,811,218
[45] Date of Patent: Sep. 22, 1998

[54] PHOTOINITIATOR COMPOSITIONS INCLUDING AMINO ACIDS, COUMARIN AND TITANOCENE AND PHOTOSENSITIVE MATERIALS USING THE SAME

[75] Inventors: Makoto Kaji; Yasunori Kojima; Shigeki Katogi; Masataka Nunomura; Hideo Hagiwara; Dai Kawasaki; Mitsumasa Kojima; Hiroshi Suzuki; Hidetaka Satou, all of Hitachi, Japan

[73] Assignee: Hitachi Chemical Company, Ltd., Tokyo, Japan

[21] Appl. No.: 503,274

[22] Filed: Jul. 17, 1995

Related U.S. Application Data

[63] Continuation-in-part of Ser. No. 274,796, Jul. 14, 1994, abandoned.

Foreign Application Priority Data

| Jul. 28, 1993 | [JP] | Japan | 5-185983 |
| Aug. 24, 1993 | [JP] | Japan | 5-209275 |
| Sep. 28, 1993 | [JP] | Japan | 5-241358 |
| Feb. 8, 1994 | [JP] | Japan | 6-014132 |
| Feb. 10, 1994 | [JP] | Japan | 6-016506 |
| Feb. 15, 1994 | [JP] | Japan | 6-017951 |

[51] Int. Cl.$^6$ .................... G03C 1/735; C08F 2/50
[52] U.S. Cl. ............... 430/281.1; 430/919; 430/921; 430/924; 430/925; 430/926; 522/14; 522/16; 522/17; 522/20; 522/59; 522/65; 502/155; 502/156; 502/167; 502/168
[58] Field of Search ............... 430/281.1, 914, 430/919, 921, 923, 924, 925, 926, 927; 522/14, 16, 17, 18, 33, 34, 45, 49, 65, 66; 502/102, 103, 104, 117, 152, 155, 156, 162, 167, 168

[56] References Cited

U.S. PATENT DOCUMENTS

| 4,238,524 | 12/1980 | LaLiberte e tal. | 427/7 |
| 4,278,751 | 7/1981 | Specht et al. | 430/281.1 |
| 4,366,217 | 12/1982 | Bird et al. | 430/11 |
| 4,987,057 | 1/1991 | Kaji et al. | 430/281.1 |
| 5,011,755 | 4/1991 | Rohde et al. | 430/18 |
| 5,178,986 | 1/1993 | Zampini et al. | 430/190 |
| 5,262,277 | 11/1993 | Sato et al. | 430/283.1 |
| 5,322,762 | 6/1994 | Kushi et al. | 430/288.1 |
| 5,591,784 | 1/1997 | Muranaka et al. | 522/74 |
| 5,616,684 | 4/1997 | Wakimasu et al. | 514/11 |

*Primary Examiner*—Bernard P. Codd
*Attorney, Agent, or Firm*—Antonelli, Terry, Stout & Kraus, LLP

[57] ABSTRACT

An N-aryl-α-amino acid (I), which is a novel compound, is effective as a photoinitiator. The photoinitiator composition including this photoinitiator is effective for improving photosensitive properties of photosensitive materials containing poly(amic acid) and an addition polymerizable compound used for pattern formation. Further, a photoinitiator composition (A) comprising an N-aryl-α-amino acid (I) or (I'), a 3-substituted coumarin (II) and/or an azabenzalcyclohexanone (III), or a photoinitiator composition (B) comprising an N-aryl-α-amino acid (I) or (I'), a 3-substituted coumarin (II) and a titanocene (IV), or a photoinitiator composition (C) comprising a 3-substituted coumarin (II), a titanocene (IV) and an oxime ester (V), is effective for improving photosensitive properties of photosensitive materials containing poly(amic acid) and an addition polymerizable compound used for pattern formation.

4 Claims, No Drawings

PHOTOINITIATOR COMPOSITIONS INCLUDING AMINO ACIDS, COUMARIN AND TITANOCENE AND PHOTOSENSITIVE MATERIALS USING THE SAME

CROSS-REFERENCE TO RELATED APPLICATIONS

This is a continuation-in-part of U.S. patent application Ser. No. 08/274,796 filed Jul. 14, 1994 now abandoned.

BACKGROUND OF THE INVENTION

This invention relates to an N-aryl-α-amino acid, photoinitiator compositions, photosensitive compositions, photosensitive materials, and processes for forming patterns using the photosensitive material.

Photosensitive compositions are widely used for forming letterpresses, relief images, photoresists, and the like generally using ultraviolet (UV) light as a light source, and are desired to have a higher sensitivity. Particularly, when photosensitive compositions are used for scanning light exposure by means of laser beams, they are required not only to be highly sensitive but also to have sufficiently high sensitivity to visible light (458, 488, 514.5 nm) which is an output wavelength of an argon laser. Further, in the case of photosensitive polyimide for thick films usable in semiconductors, it is required to have sufficient sensitivity to a g-line stepper using monochromic light (light of 435 nm), a contact exposing equipment using the whole wavelengths of a mercury lamp, and a mirror projection type exposing equipment, and to have good photosensitive wavelength properties.

In order to enhance the sensitivity, various studies have been done on photoinitiators. As the photoinitiators, there have been known benzoine and derivatives thereof, substituted or non-substituted polynuclear quinones, etc. But substances having excellent sensitivity meeting the above-mentioned objects have not been known yet.

On the other hand, polyimides or precursors thereof having photo-patterning properties by themselves are called as "photosensitive polyimides", which are used as a surface protective film for semiconductors. In order to impart photosensitivity to polyimides, various methods have been known. For example, Japanese Patent Examined Publication (JP-B) No. 55-41422 proposes a method for esterifying a poly(amic acid) with hydroxy acrylate. Japanese Patent Unexamined Publication (JP-A) Nos. 57-170929 and 54-145794 propose to introduce a photosensitive group by means of a salt bond by mixing poly(amic acid) with amino acrylate. In the case of the former (JP-B), the photo-patterning properties are relatively good, but since it is difficult to obtain a high polymer, removal of photosensitive groups becomes easily incomplete, resulting in showing a defect of poor film properties. On the other hand, in the latter case (two JP-A's), it is easy to obtain a high polymer and good film properties due to easy volatility, but photo-patterning properties are not sufficient. Particularly, in the case of photosensitive polyimides for thick films having a film thickness of 5 μm or more after cured, there is a problem in that no good patterning properties is obtained when exposed to light using an i-line stepper (light of 365 nm), a g-line stepper (light of 435 nm), a mirror projection type exposing equipment using whole wavelengths of a mercury lamp.

SUMMARY OF THE INVENTION

It is an object of the present invention to provide photoinitiator compositions used for photosensitive compositions and photosensitive materials which have an excellent photosensitive property, the photosensitive compositions, the photosensitive materials, processes for forming patterns using the photosensitive materials, namely, to provide an N-aryl-α-amino acid (I) effective as a photoinitiator, a photoinitiator composition (A) using an N-aryl-α-amino acid (I) or (I') and a 3-substituted coumarin (II) and/or an azabenzalcyclohexanone (III), a photoinitiator composition (B) using an N-aryl-α-amino acid (I) or (I'), a 3-substituted coumarin (II) and a titanocene (IV), a photoinitiator composition (C) using a 3-substituted coumarin (II), a titanocene (IV) and an oxime ester (V), a photosensitive composition using one member selected from the group consisting of these photoinitiator compositions, a photosensitive material using one member selected from the group consisting of these photoinitiator compositions, and a process for forming patterns using such photosensitive material overcoming the above-mentioned problems of prior art.

According to the new compositions of the present invention, the above problem, that is, no good patterning properties are obtained when exposed to light using an i-line stepper, a g-line stepper, and a mirror projection type exposing equipment using whole wavelengths of a mercury lamp, can be solved.

The present invention provides an N-aryl-α-amino acid of the formula:

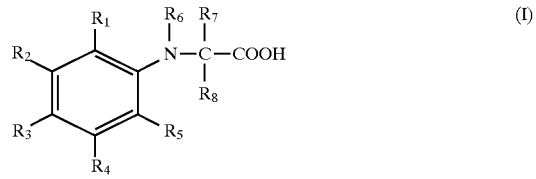

wherein $R_1$, $R_2$, $R_3$, $R_4$ and $R_5$ are independently a hydrogen atom, a halogen atom, an alkyl group having 1 to 4 carbon atoms, a cyano group, an alkoxycarbonyl group having 2 to 10 carbon atoms, a carboxyamido group or an alkylsulfonyl group having 1 to 4 carbon atoms with the alkyl moiety attached to the sulfonyl being non-substituted or substituted with a cyano group, and at least one of $R_1$ through $R_5$ is a cyano group or an alkylsulfonyl group having 1 to 4 carbon atoms; $R_6$ is a hydrogen atom, an alkyl group having 1 to 12 carbon atoms, a cycloalkyl group having 3 to 7 carbon atoms, a hydroxyalkyl group having 1 to 12 carbon atoms, an alkoxyalkyl group having 2 to 12 carbon atoms, an aminoalkyl group having 1 to 12 carbon atoms, or a substituted or non-substituted aryl group having 6 to 10 carbon atoms; and $R_7$ and $R_8$ are independently a hydrogen atom or an alkyl group having 1 to 8 carbon atoms.

The present invention also provide a photoinitiator composition (A) comprising an N-aryl-α-amino acid of the formula (I) or (I')

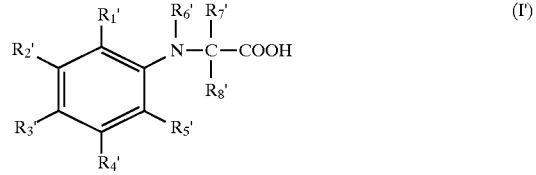

wherein $R_1'$, $R_2'$, $R_3'$, $R_4'$ and $R_5'$ are independently a hydrogen atom, a halogen atom, an alkyl group having 1 to 4 carbon atoms, a cyano group, an alkoxycarbonyl group having 2 to 10 carbon atoms, a carboxyamido group or an alkylsulfonyl group having 1 to 4 carbon atoms with the alkyl moiety attached to the sulfonyl being non-substituted or substituted with a cyano group; $R_6'$ is a hydrogen atom, an alkyl group having 1 to 12 carbon atoms, a cycloalkyl group having 3 to 7 carbon atoms, a hydroxyalkyl group having 1 to 12 carbon atoms, an alkoxyalkyl group having 2 to 12 carbon atoms, an aminoalkyl group having 1 to 12 carbon atoms, or a substituted or non-substituted aryl group having 6 to 10 carbon atoms; and $R_7'$ and $R_8'$ are independently a hydrogen atom or an alkyl group having 1 to 8 carbon atoms, and at least one member selected from the group consisting of a 3-substituted coumarin compound of the formula:

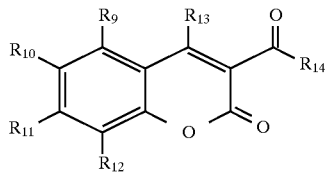

wherein $R_9$, $R_{10}$, $R_{11}$, $R_{12}$ and $R_{13}$ are independently a hydrogen atom, an amino group substituted with an alkyl group having 1 to 5 carbon atoms, an amino group substituted with two alkyl groups having 1 to 5 carbon atoms, an alkoxy group having 1 to 5 carbon atoms, an acyloxy group, an aryl group having 6 to 10 carbon atoms, a halogen atom, or a thioalkyl group having 1 to 5 carbon atoms; and $R_{14}$ is a non-substituted phenyl group, a biphenyl group, a naphthyl group, a thienyl group, a benzofuryl group, a furyl group, a pyridyl group, a coumarinyl group, an amino group, an amino group substituted with one or more alkyl groups having 1 to 5 carbon atoms, a cyano group, an alkoxy group having 1 to 5 carbon atoms, an alkyl group having 1 to 5 carbon atoms, a halogen atom, a haloalkyl group having 1 to 5 carbon atoms, a formyl group, an alkoxycarbonyl group having 1 to 5 carbon atoms, an acyloxy group having 1 to 5 carbon atoms, a phenyl group substituted with an acyloxy group having 1 to 5 carbon atoms, a cyano group, an alkoxy group having 1 to 5 carbon atoms or an acyl group having 1 to 5 carbon atoms, or said biphenyl group, said naphthyl group, said thienyl group, said benzofuryl group, said furyl group, said pyridyl group or said coumarinyl group being substituted with an acyloxy group having 1 to 5 carbon atoms or an acyl group having 1 to 5 carbon atoms, and an azabenzalcyclohexanone compound of the formula:

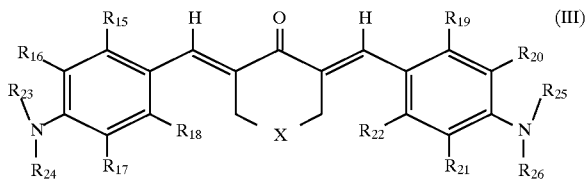

wherein $R_{15}$, $R_{16}$, $R_{17}$, $R_{18}$, $R_{19}$, $R_{20}$, $R_{21}$ and $R_{22}$ are independently a hydrogen atom, a chrorine atom, a bromine atom, an alkyl group having 1 to 12 carbon atoms, an aryl group having 6 to 10 carbon atoms or an alkoxy group having 1 to 12 carbon atoms; and $R_{23}$, $R_{24}$, $R_{25}$ and $R_{26}$ are independently an alkyl group having 1 to 6 carbon atoms; X is a non-substituted imino group or an imino group substituted with as alkyl group having 1 to 12 carbon atoms, an aralkyl group having 7 to 20 carbon atoms, an aryl group having 6 to 10 carbon atoms, an acyl group having 2 to 12 carbon atoms, an arylcarbonyl group having 7 to 20 carbon atoms, an alkoxycarbonyl group having 2 to 12 carbon atoms, or an aryloxycarbonyl group having 7 to 20 carbon atoms.

The present invention further provides a photoinitiator composition (B) comprising an N-aryl-α-amino acid of the formula (I) or (I'), a 3-substituted coumarin compound of the formula (II), and a titanocene compound of the formula:

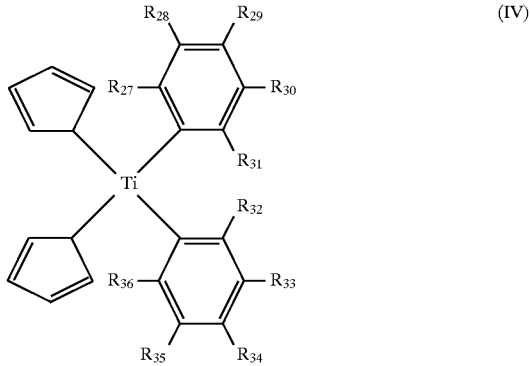

wherein $R_{27}$ through $R_{36}$ are independently a hydrogen atom, a halogen atom, an alkoxy group having 1 to 20 carbon atoms or a heterocyclic ring such as 1-pyrrolyl, 2-pyrrolyl, 3-pyrrolyl, imidazolyl, pyrazolyl, etc., wherein said heterocyclic ring may be bonded directly to a benzene ring or via an alkylene group having 1 to 12 carbon atoms, and may be non-substituted or substituted with at least one alkyl group having 1 to 12 carbon atoms, amino group, alkylamino group having 1 to 12 carbon atoms or alkoxy group having 1 to 12 carbon atoms.

The present invention still further provides a photoinitiator composition (C) comprising a 3-substituted coumarin compound of the formula (II), a titanocene compound of the formula (IV), and an oxime ester compound of the formula:

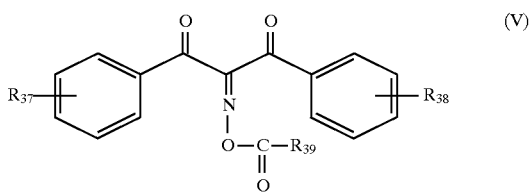

wherein $R_{37}$ and $R_{38}$ are independently a hydrogen atom, an alkyl group having 1 to 6 carbon atoms, an alkoxy group having 1 to 6 carbon atoms or a nitro group; and $R_{39}$ is an alkyl group having 1 to 12 carbon atoms, an alkoxy group having 1 to 12 carbon atoms, a phenyl group, a benzyl group, —OCH$_2$CH$_2$OCH$_3$ or —CO$_2$CH$_2$CH$_3$.

The present invention also provide a photosensitive composition comprising an addition polymerizable compound having a boiling point of 100° C. or higher under 1 atmosphere, and a photoinitiator composition (A), (B) or (C).

The present invention further provides a photosensitive material comprising (a) a poly(amic acid), (b) a compound having one or more carbon-carbon double bonds dimerizable or polymerizable by actinic radiation and one or more amino groups or a quaternary salt thereof, and (c) a photoinitiator composition (A), (B) or (C).

The present invention still further provides a process for forming a pattern using the photosensitive material mentioned above.

DESCRIPTION OF THE PREFERRED EMBODIMENTS

The N-aryl-α-amino acid of the present invention is represented by the formula:

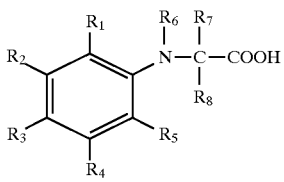

wherein $R_1$, $R_2$, $R_3$, $R_4$ and $R_5$ are independently a hydrogen atom, a halogen atom, an alkyl group having 1 to 4 carbon atoms, a cyano group, an alkoxycarbonyl group having 2 to 10 carbon atoms, a carboxyamido group or an alkylsulfonyl group having 1 to 4 carbon atoms with the alkyl moiety attached to the sulfonyl being non-substituted or substituted with a cyano group, and at least one of $R_1$ through $R_5$ is a cyano group or an alkylsulfonyl group having 1 to 4 carbon atoms; $R_6$ is a hydrogen atom, an alkyl group having 1 to 12 carbon atoms, a cycloalkyl group having 3 to 7 carbon atoms, a hydroxyalkyl group having 1 to 12 carbon atoms, an alkoxyalkyl group having 2 to 12 carbon atoms, an aminoalkyl group having 1 to 12 carbon atoms, or a substituted or non-substituted aryl group having 6 to 10 carbon atoms such as phenyl, naphthyl, etc.; and $R_7$ and $R_8$ are independently a hydrogen atom or an alkyl group having 1 to 8 carbon atoms.

The N-aryl-α-amino acid used in the photoinitiator compositions of the present invention is represented by the formula (I) or by the following formula:

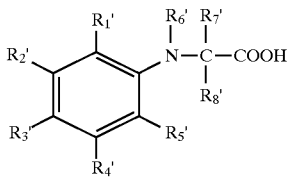

wherein $R_1'$, $R_2'$, $R_3'$, $R4'$ and $R_5'$ are independently a hydrogen atom, a halogen atom, an alkyl group having 1 to 4 carbon atoms, a cyano group, an alkoxycarbonyl group having 2 to 10 carbon atoms, a carboxyamido group or an alkylsulfonyl group having 1 to 4 carbon atoms with the alkyl moiety attached to the sulfonyl being non-substituted or substituted with a cyano group; $R_6'$ is a hydrogen atom, an alkyl group having 1 to 12 carbon atoms, a cycloalkyl group having 3 to 7 carbon atoms, a hydroxyalkyl group having 1 to 12 carbon atoms, an alkoxyalkyl group having 2 to 12 carbon atoms, an aminoalkyl group having 1 to 12 carbon atoms, or a substituted or non-substituted aryl group having 6 to 10 carbon atoms; and $R_7'$ and $R_8'$ are independently a hydrogen atom or an alkyl group having 1 to 8 carbon atoms.

The N-aryl-α-amino acid of the formula (I) or (I') can be produced, for example, by aromatic nucleophilic substitution of a corresponding substituted halobenzene with a glycine compound using an analogous process.

More concretely, the aromatic nucleophilic substitution can be carried out generally by reacting a substituted halobenzene and a glycine compound in about equimolar amounts in a polar aprotic solvent such as acetone, dimethylsulfoxide, N-methyl-pyrrolidone, N,N-dimethylacetamide, N,N-dimethylformamide, tetrahydrofuran, sulfolane, methyl ethyl ketone, ethylene carbonate, etc., in the presence of a basic compound at room temperature to about 100° C. As the basic compound, there can be used sodium carbonate, potassium carbonate, etc.

Examples of the compounds of the formula (I) or (I') are as follows:

N-(p-methylsulfonylphenyl)-N-methylglycine (Compound No. 1),
N-(p-methylsulfonylphenyl)-N-ethylglycine,
N-(p-methylsulfonylphenyl)-N-n-propylglycine,
N-(p-methylsulfonylphenyl)-N-n-butylglycine,
N-(p-cyanophenyl)-glycine (Compound No. 2),
N-(p-cyanomethylsulfonylphenyl)-N-methylglycine,
N-(p-cyanomethylsulfonylphenyl)-N-ethylglycine,
N-(p-cyanomethylsulfonylphenyl)-N-n-propylglycine,
N-(p-cyanomethylsulfonylphenyl)-N-n-butylglycine,
N-(p-ethylsulfonylphenyl)-N-methylglycine,
N-(p-ethylsulfonylphenyl)-N-ethylglycine,
N-(p-ethylsulfonylphenyl)-N-n-propylglycine,
N-(p-ethylsulfonylphenyl)-N-n-butylglycine,
N-(p-2'-cyanoethylsulfonylphenyl)-N-methylglycine,
N-(p-2'-cyanoethylsulfonylphenyl)-N-ethylglycine,
N-(p-2'-cyanoethylsulfonylphenyl)-N-n-propylglycine,
N-(p-2'-cyanoethylsulfonylphenyl)-N-n-butylglycine,
N-(p-cyanophenyl)-N-methylglycine (Compound No. 3),
N-(p-cyanophenyl)-N-ethylglycine,
N-(p-cyanophenyl)-N-n-propylglycine,
N-(p-cyanophenyl)-N-n-butylglycine,
N-(p-n-propylsulfonylphenyl)-N-methylglycine,
N-(p-n-butylsulfonylphenyl)-N-methylglycine,
N-(p-carboxyamidophenyl)-N-methylglycine,
N-(p-carboxyamidophenyl)-N-ethylglycine,
N-(p-carboxyamidophenyl)-N-n-propylglycine,
N-(p-carboxyamidophenyl)-N-n-butylglycine,
N-(p-ethoxycarbonylphenyl)-N-methylglycine,
N-(p-ethoxycarbonylphenyl)-N-ethylglycine,
N-(p-ethoxycarbonylphenyl)-N-n-propylglycine,
N-(p-ethoxycarbonylphenyl)-N-n-butylglycine,
N-(p-methoxycarbonylphenyl)-N-methylglycine,
N-(p-methoxycarbonylphenyl)-N-ethylglycine,
N-(p-methoxycarbonylphenyl)-N-n-propylglycine,
N-(p-methoxycarbonylphenyl)-N-n-butylglycine, etc.

These compounds can be used singly or as a mixture thereof, when used as a photoinitiator.

These compounds are effective as a photoinitiator which generates active radicals by the action of UV and visible light in combination of one or more suitable photosensitizers, for example, the 3-substituted coumarin compound and the azabenzalcyclohexanone compound as mentioned above.

A photoinitiator composition (A) of the present invention comprises:
an N-aryl-α-amino acid of the formula (I) or (I') mentioned above, and
at least one member selected from the group consisting of a 3-substituted coumarin compound of the formula:

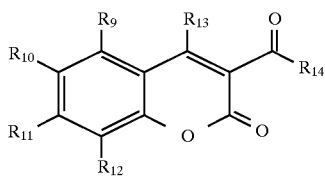

(II)

wherein $R_9$, $R_{10}$, $R_{11}$, $R_{12}$ and $R_{13}$ are independently a hydrogen atom, an amino group substituted with an alkyl group having 1 to 5 carbon atoms, an amino group substituted with two alkyl groups having 1 to 5 carbon atoms, an alkoxy group having 1 to 5 carbon atoms, an acyloxy group, an aryl group having 6 to 10 carbon atoms such as phenyl, naphthyl, etc., a halogen atom, or a thioalkyl group having 1 to 5 carbon atoms; and $R_{14}$ is a non-substituted phenyl group, a biphenyl group, a naphthyl group, a thienyl group, a benzofuryl group, a furyl group, a pyridyl group, a coumarinyl group, an amino group, an amino group substituted with one or more alkyl groups having 1 to 5 carbon atoms, a cyano group, an alkoxy group having 1 to 5 carbon atoms, an alkyl group having 1 to 5 carbon atoms, a halogen atom, a haloalkyl group having 1 to 5 carbon atoms, a formyl group, an alkoxycarbonyl group having 1 to 5 carbon atoms, an acyloxy group having 1 to 5 carbon atoms, a phenyl group substituted with an acyloxy group having 1 to 5 carbon atoms, a cyano group, an alkoxy group having 1 to 5 carbon atoms or an acyl group having 1 to 5 carbon atoms, or said biphenyl group, said naphthyl group, said thienyl group, said benzofuryl group, said furyl group, said pyridyl group or said coumarinyl group being substituted with an acyloxy group having 1 to 5 carbon atoms or an acyl group having 1 to 5 carbon atoms, and an azabenzalcyclohexanone compound of the formula:

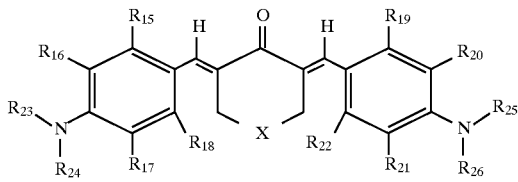

(III)

wherein $R_{15}$, $R_{16}$, $R_{17}$, $R_{18}$, $R_{19}$, $R_{20}$, $R_{21}$ and $R_{22}$ are independently a hydrogen atom, a chlorine atom, a bromine atom, an alkyl group having 1 to 12 carbon atoms, an aryl group having 6 to 10 carbon atoms such as phenyl, naphthyl, etc. or an alkoxy group having 1 to 12 carbon atoms; and $R_{23}$, $R_{24}$, $R_{25}$ and $R_{26}$ are independently an alkyl group having 1 to 6 carbon atoms; X is a non-substituted imino group or an imino group substituted with an alkyl group having 1 to 12 carbon atoms, an aralkyl group having 7 to 20 carbon atoms such as benzyl, phenethyl, etc., an aryl group having 6 to 10 carbon atoms such as phenyl, naphthyl, etc., an acyl group having 2 to 12 carbon atoms, an arylcarbonyl group having 7 to 20 carbon atoms, an alkoxycarbonyl group having 2 to 12 carbon atoms, or an aryloxycarbonyl group having 7 to 20 carbon atoms.

Examples of the 3-substituted coumarin compound of the formula (II) are as follows:

3-benzoylcoumarin,
3-benzoyl-7-methoxycoumarin,
3-benzoyl-5,7-dimethoxycoumarin,
3-(4'-cyanobenzoyl)-coumarin,
3-(4'-cyanobenzoyl)-7-methoxycoumarin,
3-(4'-cyanobenzoyl)-5,7-dimethoxycoumarin,
3-thienylcarbonylcoumarin,
7-methoxy-3-thienylcarbonyl-coumarin,
5,7-dimethoxy-3-thienylcarbonyl-coumarin,
7-N,N-diethylamino-3-thienylcarbonyl-coumarine,
7-N,N-dimethylamino-3-thienylcarbonyl-coumarin,
3-(4'-methoxybenzoyl)coumarin,
3-(4'-methoxybenzoyl)-7-methoxycoumarin,
3-(4'-methoxybenzoyl)-5,7-dimethoxycoumarin,
3,3'-carbonylbis(7-N,N-diethylaminocoumarin),
3,3'-carbonylbis(7-methoxycoumarin),
3,3'-carbonylbis(5,7-dimethoxycoumarin), etc.

These compounds can be used singly or as a mixture thereof.

Examples of the azabenzalcyclohexanone compound of the formula (III) are as follows:

2,6-bis(p-N,N-diethylaminobenzal)-4-methyl-4-azacyclohexanone,
2,6-bis(p-N,N-dimethylaminobenzal)-4-methyl-4-azacyclohexanone,
2,6-bis(p-N,N-diethylaminobenzal)-4-ethyl-4-azacyclohexanone,
2,6-bis(p-N,N-dimethylaminobenzal)-4-ethyl-4-azacyclohexanone,
2,6-bis(p-N,N-diethylaminobenzal)-4-n-propyl-4-azacyclohexanone,
2,6-bis(p-N,N-dimethylaminobenzal)-4-n-propyl-4-azacyclohexanone,
2,6-bis(p-N,N-diethylaminobenzal)-4-phenethyl-4-azacyclohexanone,
2,6-bis(p-N,N-dimethylaminobenzal)-4-benzyl-4-azacyclohexanone,
2,6-bis(p-N,N-dimethylaminobenzal)-4-acetyl-4-azacyclohexanone,
2,6-bis(p-N,N-dimethylaminobenzal)-4-benzoyl-4-azacyclohexanone, etc.

These compounds can be synthesized by the method shown in U.S. Pat. No. 4,987,057.

These compounds can be used singly or as a mixture thereof.

The N-aryl-α-amino acid of the formula (I) or (I') and the 3-substituted coumarin compound of the formula (II) and/or the azabenzalcyclohexanone compound of the formula (III) may be used in various proportions, but the N-aryl-α-amino acid by the formula (I) or (I') is preferably used in a larger amount than that of the compound of the formula (II) and/or (III). Generally, in case of using either the compound of the formula (II) or (III), the compound of the formula (II) or (III) is used in an amount of 1 to 100 parts by weight per 100 parts by weight of the compound of the formula (I) or (I'), and in case of using both the compounds of the formulae (II) and (III), a total amount of the compounds of the formulae (II) and (III) is used in an amount of 1 to 100 parts by weight per 100 parts by weight of the compound of the formula (I) or (I').

Another photoinitiator composition (B) of the present invention comprises
an N-aryl-α-amino acid of the formula (I) or (I'),
a 3-substituted coumarin compound of the formula (II), and a titanocene compound of the formula:

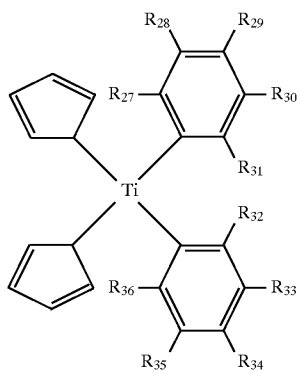

wherein $R_{27}$ through $R_{36}$ are independently a hydrogen atom, a halogen atom, an alkoxy group having 1 to 20 carbon atoms or a heterocyclic ring such as pyrrole, etc., wherein said heterocyclic ring may be bonded directly to a benzene ring or via an alkylene group having 1 to 12 carbon atoms and may be non-substituted or substituted with at least one alkyl group having 1 to 12 carbon atoms, amino group, alkylamino group having 1 to 12 carbon atoms or alkoxy group having 1 to 12 carbon atoms.

Examples of the titanocene compound of the formula (IV) are as follows:

bis(cyclopentadienyl)-bis[2,6-difluoro-3-{2-(pyrrol-1-yl)ethyl}phenyl] titanium,
bis(cyclopentadienyl)-bis[2,6-difluoro-3-{2-(pyrrol-1-yl)propyl}phenyl] titanium,
bis(cyclopentadienyl)-bis[2,6-difluoro-3-{2-(pyrrol-1-yl)methyl}phenyl] titanium,
bis(cyclopentadienyl)-bis[2,6-difluoro-3-(pyrrol-1-yl)phenyl] titanium,
bis(cyclopentadienyl)-bis[2,6-difluoro-3-(2,5-dimethylpyrrol-1-yl)phenyl] titanium,
bis(cyclopentadienyl)-bis[2,6-difluoro-3-(2,5-diethylpyrrol-1-yl)phenyl] titanium,
bis(cyclopentadienyl)-bis[2,6-difluoro-3-(2,5-diisopropylpyrrol-1-yl)phenyl] titanium,
bis(cyclopentadienyl)-bis[2,6-difluoro-3-(2,5-bisdimethylaminopyrrol-1-yl)phenyl] titanium,
bis(cyclopentadienyl)-bis[2,6-difluoro-3-(2,5-dimethyl-3-methoxypyrrol-1-yl)phenyl] titanium,
bis(cyclopentadienyl)-bis[2,6-difluoro-3-methoxyphenyl] titanium,
bis(cyclopentadienyl)-bis[2,6-difluoro-3-ethoxyphenyl] titanium,
bis(cyclopentadienyl)-bis[2,6-difluoro-3-isopropoxyphenyl] titanium,
bis(cyclopentadienyl)-bis[2,6-difluoro-3-n-propoxyphenyl] titanium, etc.

These titanocene compounds can be used singly or as a mixture thereof.

The compound of the formula (II) and the compound of the formula (IV) may be used in various proportions, but the compound of the formula (II) is preferably used in an amount of 1 to 100 parts by weight, and the compound of the formula (IV) is preferably used in an amount of 10 to 300 parts by weight, per 100 parts by weight of the compound of the formula (I) or (I').

A further photoinitiator composition (C) of the present invention comprises:

a 3-substituted coumarin compound of the formula (II), a titanocene compound of the formula (IV), and an oxime ester compound of the formula:

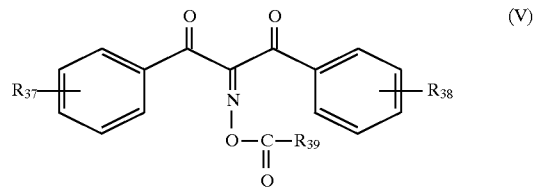

wherein $R_{37}$ and $R_{38}$ are independently a hydrogen atom, an alkyl group having 1 to 6 carbon atoms, an alkoxy group having 1 to 6 carbon atoms or a nitro group; and $R_{39}$ is an alkyl group having 1 to 12 carbon atoms, an alkoxy group having 1 to 12 carbon atoms, a phenyl group, a benzyl group, —$OCH_2CH_2OCH_3$ or —$CO_2CH_2CH_3$.

Examples of the oxime ester compound of the formula (V) are as follows:

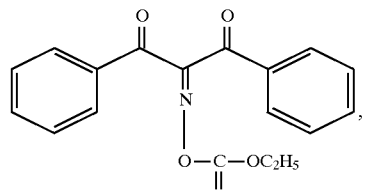

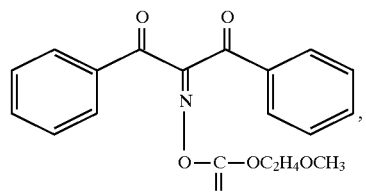

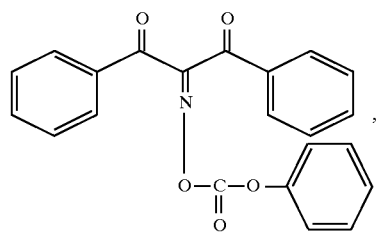

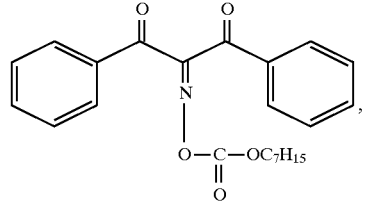

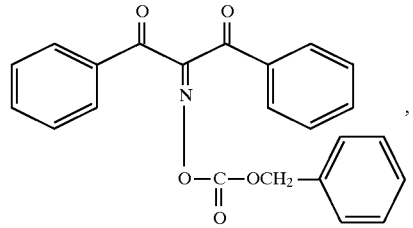

-continued

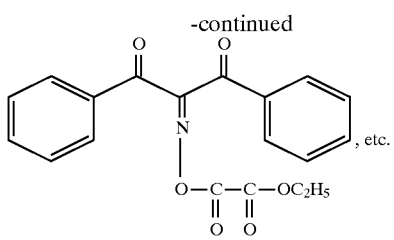
, etc.

These compounds can be used singly or as a mixture thereof.

The compounds of the formulae (II), (IV) and (V) may be used in various proportions, but are preferably used in amounts so as to make the titanocene compound and the oxime ester compound larger by weight than the 3-substituted coumarin compound. More concretely, the compound of the formula (II) is preferably used in an amount of 1 to 100 parts by weight, the compound of the formula (IV) is preferably used in an amount of 10 to 300 parts by weight, per 100 parts by weight of the compound of the formula (V).

The photosensitive composition of the present invention comprises an addition polymerizable compound having a boiling point of 100° C. or higher under 1 atmosphere, and a photoinitiator composition (A), (B) or (C).

The photosensitive composition may further contain, if necessary, one or more conventional photopolymerization initiators.

Examples of the photopolymerization initiator are as follows:

Michler's ketone,
benzoin methyl ether,
benzoin ethyl ether,
benzoin isopropyl ether,
2-t-butylanthraquinone,
2-ethylanthraquinone,
4,4'-bis(N,N-diethylamino)benzophenone,
acetophenone,
benzophenone,
thioxanthone,
2,2-dimethoxy-2-phenylacetophenone,
1-hydroxycyclohexylphenyl ketone,
2-methyl-[4-(methylthio)phenyl]-2-morpholino-1-propanone,
benzil,
diphenyl disulfide,
phenanthrenequinone,
2-isopropylthioxanthone,
riboflavine tetrabutyrate,
N-phenyldiethanolamine,
2-(O-ethoxycarbonyl)oxyimino-1,3-diphenylpropanedione,
1-phenyl-2-(O-ethoxycarbonyl)oxyiminopropan-1-one,
3,3',4,4'-tetra(t-butylperoxycarbonyl)benzophenone, etc.

These photopolymerization initiators can be used singly or as a mixture thereof.

The photopolymerization initiators may be used in various proportions.

The addition polymerizable compound should have a boiling point of 100° C. or higher under 1 atmosphere. When the addition polymerizable compound has a boiling point of lower than 100° C. under 1 atmosphere, it evaporates at the time of removing a solvent in a system, for example, by drying or at the time of irradiation with actinic radiation, resulting in giving undesirable properties. Further, in order to obtain a uniform composition with a photoinitiator composition, it is preferable to use those soluble in conventionally used organic solvents.

As a solvent usable for the photosensitive composition, there can be used acetone, methyl ethyl ketone, diethyl ketone, toluene, chloroform, methanol, ethanol, 1-propanol, 2-propanol, 1-butanol, 2-butanol, t-butanol, ethylene glycol monomethyl ether, ethylene glycol monoethyl ether, xylene, tetrahydrofuran, dioxane, N,N-dimethylacetamide, N,N-dimethylformamide, N-methyl-2-pyrrolidone, γ-butyrolactone, dimethylsulfoxide, ethylene carbonate, propylene carbonate, sulfolane, etc. These solvents can be used singly or as a mixture thereof.

As the addition polymerizable compound having a boiling point of 100° C. or higher under 1 atmosphere, there can preferably be used those obtained by condensing a polyhydric alcohol with an α,β-unsaturated carboxylic acid.

Examples of such compounds are ethylenically unsaturated compounds as follows:

ethylene glycol di(meth)acrylate (di(meth)acrylate means "diacrylate" or "dimethacrylate", hereinafter used in this manner),
triethylene glycol di(meth)acrylate,
tetraethylene glycol di(meth)acrylate,
trimethylolpropane di(meth)acrylate,
trimethylolpropane tri(meth)acrylate,
1,2-propylene glycol di(meth)acrylate,
di(1,2-propylene glycol) di(meth)acrylate,
tri(1,2-propylene glycol) di(meth)acrylate,
tetra(1,2-propylene glycol) di(meth)acrylate,
dimethylaminoethyl (meth)acrylate,
diethylaminoethyl (meth)acrylate,
dimethylaminopropyl (meth)acrylate,
diethylaminopropyl (meth)acrylate,
1,4-butanediol di(meth)acrylate,
1,6-hexanediol di(meth)acrylate,
pentaerythritol tri(meth)acrylate,
pentaerythritol tetra(meth)acrylate,
styrene,
divinylbenzene,
4-vinyltoluene,
4-vinylpyridine,
N-vinylpyrrolidone,
2-hydroxyethyl (meth)acrylate,
1,3-(meth)acryloyloxy-2-hydroxypropane,
methylenebisacrylamide,
N,N-dimethylacrylamide,
N-methylolacrylamide, etc.

These compounds can be used singly or as a mixture thereof.

The photoinitiator composition (A), (B) or (C) is used in an amount of 0.01 to 30% by weight, preferably 0.05 to 10% by weight, based on the weight of the addition polymerizable compound having a boiling point of 100° C. or higher under 1 atmosphere from the viewpoint of photosensitivity and film strength.

The photosensitive composition of the present invention may further contain, if necessary, one or more organic polymer having a high molecular weight of preferably 10,000 to 700,000.

Examples of such an organic polymer are as follows:
(A) Copolyesters

Copolyesters obtained by reacting a polyhydric alcohol, for example, diethylene glycol, triethylene glycol, tetraethylene glycol, trimethylolpropane, neopentyl glycol, etc. with a polyvalent carboxylic acid, for example, terephthalic acid, isophthalic acid, sebacic acid, adipic acid, etc.
(B) Vinyl polymers Homopolymers or copolymers of vinyl monomers such as methacrylic acid, acrylic acid, alkyl esters of methacrylic acid or acrylic acid, for example, methyl (meth)acrylate, ethyl (meth)acrylate, butyl (meth)acrylate, 2-hydroxyethyl (meth)acrylate, phenyl (meth)acrylate, benzyl (meth) acrylate, 2-dimethylaminoethyl (meth)acrylate, 2-ethylhexyl (meth)acrylate, etc.
(C) Polyformaldehydes
(D) Polyurethanes
(E) Polycarbonates
(F) Polyamides
(G) Poly(amic acid)s Poly(amic acid)s can be prepared by addition polymerization of a tetracarboxylic dianhydride and a diamine compound.

Examples of the tetracarboxylic dianhydride are as follows:
pyromellitic dianhydride,
3,3',4,4'-benzophenonetetracarboxylic dianhydride,
3,3',4,4'-biphenyltetracarboxylic dianhydride,
1,2,5,6-naphthalenetetracarboxylic dianhydride,
2,3,6,7-naphthalenetetracarboxylic dianhydride,
2,3,5,6-pyridinetetracarboxylic dianhydride,
1,4,5,8-naphthalenetetracarboxylic dianhydride,
3,4,9,10-perylenetetracarboxylic dianhydride,
4,4'-sulfonyldiphthalic dianhydride,
m-terphenyl-3,3",4,4"-tetracarboxylic dianhydride,
p-terphenyl-3,3",4,4"-tetracarboxylic dianhydride,
4,4'-oxydiphthalic dianhydride,
1,1,1,3,3,3-hexafluoro-2,2-bis(2,3-dicarboxyphenyl) propane dianhydride,
1,1,1,3,3,3-hexafluoro-2,2-bis(3,4-dicarboxyphenyl) propane dianhydride,
2,2-bis(2,3-dicarboxyphenyl)propane dianhydride,
2,2-bis(3,4-dicarboxyphenyl)propane dianhydride,
1,1,1,3,3,3-hexafluoro-2,2-bis[4-(2,3-dicarboxyphenoxy) phenyl]propane dianhydride,
1,1,1,3,3,3-hexafluoro-2,2-bis[4-(3,4-dicarboxyphenoxy) phenyl]propane dianhydride, etc.

As the diamine compound, aromatic diamines, heterocyclic diamines and aliphatic diamines can be used.

Examples of the aromatic diamines are as follows:
p-phenylenediamine,
m-phenylenediamine,
p-xylylenediamine,
m-xylylenediamine,
1,5-diaminonaphthalene,
benzidine,
3,3'-dimethylbenzidine,
3,3'-dimethoxybenzidine,
4,4'-(or 3,4'-, 3,3'-, or 2,4'-)diaminodiphenylmethane,
4,4'-(or 3,4'-, 3,3'-, or 2,4'-)diaminodiphenyl ether,
4,4'-(or 3,4'-, 3,3'-, or 2,4'-)diaminodiphenylsulfone,
4,4'-(or 3,4'-, 3,3'-, or 2,4'-)diaminodiphenylsulfide,
4,4'-benzophenonediamine,
3,3'-benzophenonediamine,
4,4'-di(4-aminophenoxy)phenylsulfone,
4,4'-bis(4-aminophenoxy)biphenyl,
1,4-bis(4-aminophenoxy)benzene,
1,3-bis(4-aminophenoxy)benzene,
1,1,1,3,3,3-hexafluoro-2,2-bis(4-aminophenyl)-propane,
2,2-bis[4-(4-aminophenoxy)phenyl]propane,
3,3'-dimethyl-4,4'-diaminodiphenylmethane,
3,3',5,5'-tetramethyl-4,4'-diaminodiphenylmethane,
4,4'-di(3-aminophenoxy)phenylsulfone,
3,3'-diaminodiphenylsulfone,
2,2'-bis(4-aminophenyl)propane, etc.

Examples of the heterocyclic diamines are as follows:
2,6-diaminopyridine,
2,4-diaminopyrimidine,
2,4-diamino-s-triazine,
2,7-diaminodibenzofuran,
2,7-diaminocarbazole,
3,7-diaminophenothiazine,
2,5-diamino-1,3,4-thiadiazole,
2,4-diamino-6-phenyl-s-triazine, etc.

Examples of the aliphatic diamines are as follows:
trimethylenediamine,
tetramethylenediamine,
hexamethylenediamine,
2,2-dimethylpropylenediamine,
diaminopolysiloxanes of the formula:

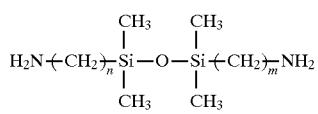

wherein n and m are the same or different integers of 1 to 10.

These tetracarboxylic dianhydrides and diamine compounds can be used singly or as a mixture thereof.
(H) Cellulose esters Cellulose esters such as methyl cellulose, ethyl cellulose, etc.

By adding the organic polymer having a high molecular weight to the photosensitive composition, it is possible to improve adhesiveness to a substrate, chemical resistance, film forming properties, etc. The organic polymer having a high molecular weight can preferably be added in an amount of 20 to 80% by weight based on the total weights of the organic polymer having a high molecular weight and the addition polymerizable compound from the viewpoint of photocurability.

In case of adding the organic polymer having a high molecular weight to the photosensitive composition, an amount of using the photoinitiator composition (A), (B) or (C) is the same as the amount of using the photoinitiator composition (A), (B) or (C) described above.

Preferable examples of the photosensitive composition of the present invention are as follows:
(i) a combination of N-(p-cyanophenyl)-glycine, 7-N,N-diethylamino-3-thienylcarbonyl-coumarin, bis(cyclopentadienyl)-bis[2,6-difluoro-3-(pyrrol-1-yl) phenyl]titanium, 3'-dimethylaminopropyl methacrylate and poly(amic acid) obtained by reacting 4,4'-diaminodiphenyl ether with pyromellitic dianhydride, (ii) a combination of N-(p-methylsulfonylphenyl)-N-methylglycine, 7-N,N-diethylamino-3-thienylcarbonyl-coumarin, 2,6-bis(p-N,N-diethylaminobenzal)-4-methyl-4-azacyclohexanone, 3'-dimethylaminopropyl methacrylate and poly(amic acid) obtained by reacting 4,4'-diaminodiphenyl ether with pyromellitic dianhydride, and (iii) a combination of 7-N,N-diethylamino-3-thienylcarbonyl-coumarin, bis(cyclopentadienyl)-bis[2,6-difluoro-3-(pyrrol-1-yl)phenyl]titanium, 1,3-diphenyl-1,2,3-propanetrion-2-(O-ethoxycarbonyl)oxime, 3'-dimethylaminopropyl methacrylate and poly(amic acid) obtained by reacting 4,4'-diaminodiphenyl ether with pyromellitic dianhydride.

The photosensitive composition may further contain, if necessary, one or more colorants such as dyes, pigments, etc.

Examples of the colorants are fuchsin, Crystal Violet, Methyl Orange, Nile Blue 2B, Victoria pure blue, Malachite Green, Night Green B, Spilon Blue, etc.

In order to enhance stability of the photosensitive composition during storage, it is possible to add a radical polymerization inhibitor or a radical polymerization retarder. Examples of such an inhibitor or retarder are p-methoxyphenol, p-benzoquinone, hydroquinone, pyrogallol, naphthylamine, phenothiazine, aryl phosphite, nitrosoamine, etc.

The photosensitive composition of the present invention can be used as a photosensitive resin composition. Further, the photosensitive composition of the present invention can contain one or more other additives such as plasticizers, adhesion promoting agents, etc.

The photosensitive material of the present invention comprises (a) a poly(amic acid) such as that mentioned above, (b) a compound having one or more carbon-carbon double bonds dimerizable or polymerizable by actinic radiation and one or more amino groups or a quaternary salt thereof, said compound being selected from the addition polymerizable compound having a boiling point of 100° C. or higher under 1 atmosphere, and (c) a photoinitiator composition (A), (B) or (C).

The poly(amic acid) (a) is preferably used in an equimolar amount in terms of the carboxyl group of the poly(amic acid) with regard to the compound (b). The photoinitiator composition (c) is preferably used in an amount of 0.01 to 30% by weight, more preferably 0.05 to 10% by weight, based on the weight of the compound (b).

Examples of the compound (b), that is, the compound having one or more carbon-carbon double bonds dimerizable or polymerizable by actinic radiation and one or more amino groups or a quaternary salt thereof, are as follows:

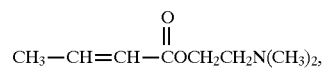

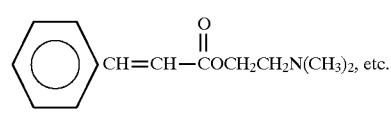

The photosensitive material may contain one or more bisazide compounds.

Examples of the bisazide compounds are as follows:

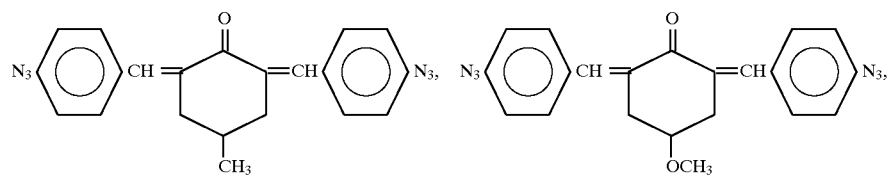

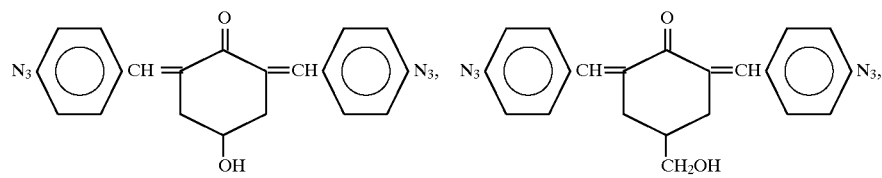

-continued

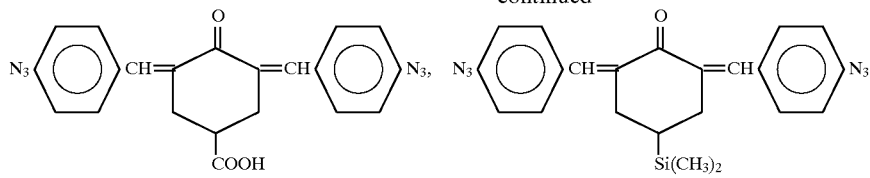

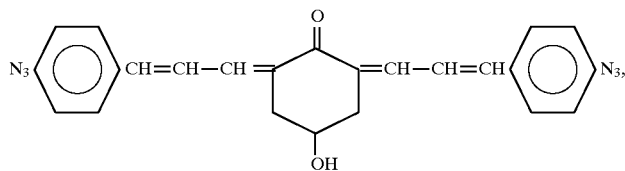

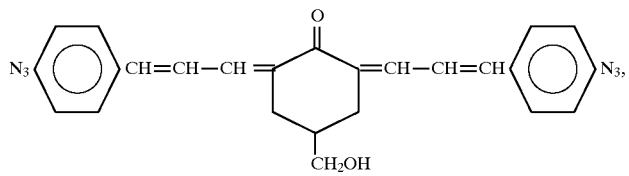

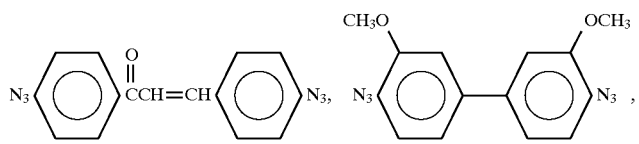

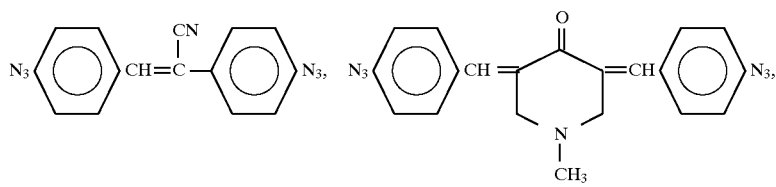

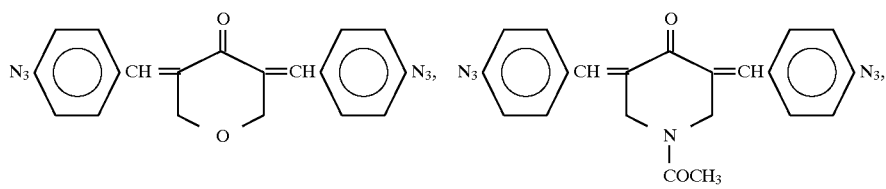

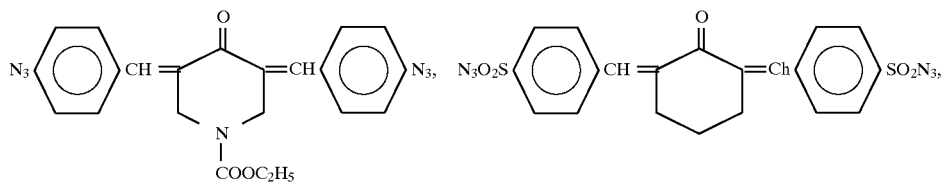

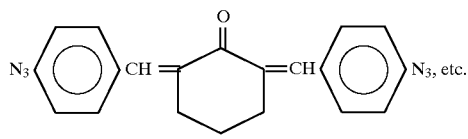

The bisazide compound is preferably used in an amount of 0.01 to 10% by weight based on the weight of the poly(amic acid) (a).

As a solvent for the photosensitive material, there can be used N,N-dimethylacetamide, N,N-dimethylformamide, N-methyl-2-pyrrolidone, γ-butyrolactone, dimethylsulfoxide, sulfolane, etc., or a mixture of at least one solvent mentioned above and xylene, toluene, methyl ethyl ketone, diethyl ketone, etc.

The process for forming a pattern of the present invention comprises coating the photosensitive material on a substrate, drying the photosensitive material, exposing the photosensitive material to light, and developing the photosensitive material to give the desired pattern.

More concretely, the pattern formation is carried out as follows. The photosensitive material is coated on a substrate such as a silicon wafer, a metallic substrate, a glass substrate, a ceramic substrate, or the like, by an immersion method, a spray method, a screen printing method, a spin coating method, etc. Almost of the solvent can be removed by drying with heating to form a coated film without sticking properties. On the coated film, a mask having a desired pattern is placed and subjected to irradiation of actinic radiation. Examples of the actinic radiation are ultraviolet light, deep ultraviolet light, visible light, electron beams, X-rays, etc. After exposure to light, non-exposed portions are removed by a suitable developing solution to give a desired pattern. As the developing solution, there can be used good solvents such as N,N-dimethylformamide, N,N-dimethylacetamide, N-methyl-2-pyrrolidone, etc., and a mixture of such a good solvent and a poor solvent such as lower alcohols, water, aromatic hydrocarbons, etc. After development, rinse is carried out, if necessary, with a poor solvent, followed by drying at about 100° C. to make the pattern stable.

The present invention is illustrated by way of Examples, in which all percents are by weight unless otherwise specified.

EXAMPLE 1

Synthesis of N-(p-methylsulfonyl)-N-methylglycine (Compound No. 1)

In a 500-ml pear-shaped flask, 4-fluorophenylmethylsulfone (15.01 g, 86.26 mmoles), N-methylglycine (8.45 g, 94.89 mmoles) and potassium carbonate (14.28 g, 103.48 mmoles) were placed, followed by addition of 1200 ml of dimethylsulfoxide as a solvent. A water cooling pipe was attached to the flask and the reaction was carried out with heating on an oil bath heated at 100° C. for 9 hours with stirring using a magnetic stirrer. After cooling naturally, the reaction mixture was dissolved in 1 liter of water, and subjected to acidolysis with 1/10N HCl, followed by filtration of a precipitate. After washing with water well, the precipitate was washed with hexane/benzene (4/1 in volume ratio). The yield of the product after dried was 12.13 g (49.92 mmoles, 57.9%). The melting point was 161.2° C.

EXAMPLE 2

Synthesis of N-(p-cyanophenyl)-glycine (Compound No. 2)

In a 500-ml three-necked flask, 4-cyanoaniline (100 g, 847.4 mmoles) was placed, followed by addition of 300 ml of water and attachment of a water cooling pipe, a mechanical stirrer and a dropping funnel. The flask was heated on an oil bath heated at 100° C. To the flask, an aqueous solution (water 150 ml) of monochloroacetic acid (104 g, 1116 mmoles) was added dropwise for about 30 minutes, followed by reflux with heating for 2.5 hours. After cooling naturally, about 100 ml of ethyl acetate was added to the flask to dissolve an insoluble matter. An organic layer was separated by a separatory funnel. The residual water layer and an aqueous layer obtained by extracting the organic layer with 100 ml of 5% (by weight) NaOH solution were combined, followed by acidolysis with 1/10N HCl. A precipitate produced was filtered and washed with water several times. After drying in an oven heated at 60° C. for 3 hours, the dried precipitate was dried in a vacuum desiccator overnight. The resulting product was a beige powder which showed no melting point but decomposed at 233.1° C. The yield was 38.8 g (26%).

EXAMPLE 3

Synthesis of N-(p-cyanophenyl)-N-methylglycine (Compound No. 3)

In a 500-ml pear-shaped flask, 4-fluorobenzonitrile (10.44 g, 86.26 mmoles), N-methylglycine (8.45 g, 94.89 mmoles) and potassium carbonate (14.28 g, 103.48 mmoles) were placed, followed by addition of 200 ml of dimethylsulfoxide as a solvent. A water cooling pipe was attached to the flask, and the reaction was carried out with heating on an oil bath heated at 100° C. for 9 hours with stirring using a magnetic stirrer. After cooling naturally, the reaction mixture was dissolved in 1 liter of water and subjected to acidolysis with 1/10N HCl, followed by filtration of a precipitate. After washing with water well, the precipitate was washed with hexane/benzene (4/1 in volume ratio). The yield of the product after dried was 14.21 g (74.79 mmoles, 86.7%). The melting point was 64.5° C.

The structure of the Compound Nos. 1 to 3 was confirmed by $H^1$-NMR spectra shown in Table 1.

TABLE 1

| Compound No. | Chemical shift | Number of proton | Kind of proton | Coupling constant (Hz) |
|---|---|---|---|---|
| 1 | 3.00(s) | 3H | $CH_3SO_3$—Ar— | — |
|  | 3.15(s) | 3H | N—$CH_3$ | — |
|  | 4.11(s) | 2H | N—$CH_2$—$CO_2H$ | — |
|  | 6.73(d) | 2H | Ar—H | 9.03 |
|  | 7.72(d) | 2H | Ar—H | 8.96 |
| 2 | 4.04(d) | 2H | N—$CH_2CO_2H$ | 5.20 |
|  | 6.08(s) | 1H | NH | — |
|  | 6.78(d) | 2H | Ar—H | 8.80 |
|  | 7.47(d) | 2H | Ar—H | 8.80 |
| 3 | 3.12(s) | 3H | N—$CH_3$ | — |
|  | 4.15(s) | 2H | N—$CH_2$—$CO_2H$ | — |
|  | 6.65(d) | 2H | Ar—H | 9.09 |
|  | 7.49(d) | 2H | Ar—H | 9.10 |

EXAMPLES 4 TO 8, COMPARATIVE EXAMPLES 1 AND 2

A photosensitive material was prepared by mixing 10 g of N-methyl-2-pyrrolidone solution of poly(amic acid) (solid content 20%) obtained by reacting 4,4'-diaminodiphenyl ether with pyromellitic dianhydride in equimolar amounts, 1.8 g of 2-dimethylaminoethyl methacrylate, and a photoinitiator composition (A) as shown in Table 2 with stirring.

After filtering with a filter, the photosensitive material was spin coated on a silicon wafer. After heating on a hot plate at 100° C. for 200 seconds, the solvent was removed to give a photosensitive coated film. The film thickness after dried was 10 μm.

The photosensitive coated film was exposed to light via a photomask using a ultrahigh pressure mercury lamp. The light exposure amount was 500 mJ/cm$^2$. The resulting film was subjected to immersion development using a mixed solution of N-methyl-2-pyrrolidone and methyl alcohol (4/1 in volume ratio), followed by rinsing with isopropanol. After development, the shape of pattern was measured and observed. A normalized film thickness after development (NFTAD) (a value obtained by dividing the film thickness by the initial time film thickness) and a minimum open through-hole diameter (open diameter) were shown in Table 2.

In Example 4, wherein N-(p-methylsulfonylphenyl)-N-methylglycine was used for the wafer, the finally cured film was obtained by heating at 100° C. for 15 minutes, at 200° C. for 20 minutes and at 350° C. for 60 minutes in a nitrogen atmosphere. The film thickness of finally cured film was 5 μm with good polyimide pattern.

As shown in Table 2, according to the data of NFTAD and open diameter, the evaluation that the photosensitive materials of the present invention have an excellent resolution can be admitted, therefore the photosensitive materials of the present invention are excellent in photosensitive properties compared with Comparative Examples.

A pattern was formed and the normalized film thickness after development (NFTAD) and open diameter were measured in the same manner as described in Examples 4 to 8, and listed in Table 3. In Table 3, the shape of pattern was also listed.

TABLE 2

| Example No. | | Example | | | | | Comparative Example | |
|---|---|---|---|---|---|---|---|---|
| | | 4 | 5 | 6 | 7 | 8 | 1 | 2 |
| Photo-initiator composition (A) | DETC | 10 mg | 10 mg | 10 mg | 0 | 0 | 10 mg | 0 |
| | ACH | 0 | 0 | 0 | 10 mg | 10 mg | 0 | 10 mg |
| | Compound No.1 | 100 mg | 0 | 0 | 100 mg | 0 | 0 | 0 |
| | Compound No.2 | 0 | 100 mg | 0 | 0 | 100 mg | 0 | 0 |
| | Compound No.3 | 0 | 0 | 100 mg | 0 | 0 | 0 | 0 |
| Evaluation | NFTAD (%) | 98 | 97 | 98 | 96 | 99 | 65 | 0 |
| | Open diameter ($\mu$m) | 8 | 8 | 8 | 8 | 8 | 10 | No pattern was obtained |

Note)
DETC = 7-N,N-diethylamino-3-thienylcarbonyl-coumarin
ACH = 2,6-bis(p-N,N-diethylaminobenzal)-4-methyl-azacyclohexanone

EXAMPLES 9 TO 14, COMPARATIVE EXAMPLES 3 TO 5

N-(p-cyanophenyl)-glycine was synthesized in the same manner as described in Example 2.

N-(p-cyanophenyl)-N-methylglycine was synthesized in the same manner as described in Example 3.

A photosensitive material was prepared by mixing 10 g of N-methyl-2-pyrrolidone solution of poly(amic acid) (solid content 20%) obtained by reacting 4,4'-diaminodiphenyl ether with pyromellitic dianhydride in equimolar amounts, 1.8 g of 2-dimethylaminoethyl methacrylate, and a photoinitiator composition (B) as shown in Table 3 with stirring.

As to the wafer of Example 12, the finally cured film was obtained by heating at 100° C. for 15 minutes, at 200° C. for 20 minutes and at 350° C. for 60 minutes in a nitrogen atmosphere. The film thickness of finally cured film was 10 $\mu$m with good polyimide pattern.

As shown in Table 3, according to the data of NFTAD and the open diameter, the evaluation that the photosensitive materials of the present invention have an excellent resolution can be admitted, therefore the photosensitive materials of the present invention are excellent in photosensitive properties compared with Comparative Examples.

TABLE 3

| Example No. | | Example | | | | | | Comparative Example | | |
|---|---|---|---|---|---|---|---|---|---|---|
| | | 9 | 10 | 11 | 12 | 13 | 14 | 3 | 4 | 5 |
| Photo-initiator composition (B) | BC | 10 mg | 0 | 0 | 10 mg | 10 mg | 0 | 10 mg | 0 | 0 |
| | MOBC | 0 | 10 mg | 0 | 0 | 0 | 10 mg | 0 | 0 | 0 |
| | DETC | 0 | 0 | 10 mg | 0 | 0 | 0 | 0 | 0 | 0 |
| | Titanocene 1 | 100 mg | 100 mg | 100 mg | 100 mg | 100 mg | 100 mg | 0 | 100 mg | 100 mg |
| | Compound No.2 | 0 | 0 | 0 | 100 mg | 0 | 100 mg | 100 mg | 0 | 100 mg |
| | Compound No.3 | 0 | 0 | 0 | 0 | 100 mg | 0 | 0 | 0 | 0 |
| Evaluation | NFTAD (%) | 78 | 77 | 78 | 96 | 99 | 95 | 60 | 25 | 25 |
| | Open diameter ($\mu$m) | 8 | 8 | 8 | 8 | 8 | 10 | 20 | 100 | 100 |
| | Shape of pattern | Good | Good | Good | Good | Good | Good | Undercut | Swollen | Swollen |

Note)
BC = 3,3'-carbonylbis(7-N,N-diethylaminocoumarin)
MOBC = 3,3'-carbonylbis(7-methoxycoumarin)
DETC = 7-N,N-diethylamino-3-thienylcarbonyl-coumarin
Titanocene 1 = bis(cyclopentadienyl)-bis[2,6-difluoro-3-(pyrrol-1-yl)-phenyl]titanium

EXAMPLES 15 TO 20, COMPARATIVE EXAMPLES 6 TO 8

To the same photosensitive materials used in Examples 9 to 14 and Comparative Examples 3 to 5, 20 mg of 4,4'-bisazido-3,3'-dimethoxybiphenyl (AZ) was added and subjected to the same tests as in Examples 15 to 20.

The results are shown in Table 4.

As shown in Table 4, according to the data of NFTAD and open diameter, the evaluation that the photosensitive materials of the present invention have an excellent resolution can be admitted, and by the addition of bisazide compound, the normalized film thickness after development is improved.

1.8 g of 2-dimethylaminoethyl methacrylate, and a photoinitiator composition (C) as shown in Table 5 with stirring.

A pattern was formed and the normalized film thickness after development (NFTAD) and open diameter were measured in the same manner as described in Examples 4 to 8, and listed in Table 5. In Table 5, the shape of pattern was also listed.

As to the wafer of Example 24, the finally cured film was obtained by heating at 100° C. for 15 minutes, at 200° C. for 20 minutes, and at 350° C. for 60 minutes in a nitrogen atmosphere. The film thickness of finally cured film was 10 $\mu$m with good polyimide pattern.

TABLE 4

|  |  | Example |  |  |  |  |  | Comparative Example |  |  |
|---|---|---|---|---|---|---|---|---|---|---|
| Example No. |  | 15 | 16 | 17 | 18 | 19 | 20 | 6 | 7 | 8 |
| Photo-initiator composition (B) | BC | 10 mg | 0 | 0 | 10 mg | 10 mg | 0 | 10 mg | 0 | 0 |
|  | MOBC | 0 | 10 mg | 0 | 0 | 0 | 10 mg | 0 | 0 | 0 |
|  | DETC | 0 | 0 | 10 mg | 0 | 0 | 0 | 0 | 0 | 0 |
|  | Titanocene 1 | 100 mg | 100 mg | 100 mg | 100 mg | 100 mg | 100 mg | 0 | 100 mg | 100 mg |
|  | Compound No.2 | 0 | 0 | 0 | 100 mg | 0 | 100 mg | 100 mg | 0 | 100 mg |
|  | Compound No.3 | 0 | 0 | 0 | 0 | 100 mg | 0 | 0 | 0 | 0 |
| Additive | AZ | 20 mg | 20 mg | 20 mg | 20 mg | 20 mg | 20 mg | 20 mg | 20 mg | 20 mg |
| Evaluation | NFTAD (%) | 85 | 85 | 85 | 100 | 100 | 100 | 65 | 30 | 30 |
|  | Open diameter ($\mu$m) | 8 | 8 | 8 | 8 | 8 | 10 | 20 | 100 | 100 |
|  | Shape of pattern | Good | Good | Good | Good | Good | Good | Undercut | Swollen | Swollen |

EXAMPLES 21 TO 26, COMPARATIVE EXAMPLES 9 TO 14

A photosensitive material was prepared by mixing 10 g of N-methyl-2-pyrrolidone solution of poly(amic acid) (solid content 20%) obtained by reacting 4,4'-diaminodiphenyl ether with pyromellitic dianhydride in equimolar amounts, As shown in Table 5, according to the data of NFTAD and open diameter, the evaluation that the photosensitive materials of the present invention have an excellent resolution can be admitted, therefore the photosensitive materials of the present invention are excellent in photosensitive properties compared with those of Comparative Examples.

TABLE 5

|  |  | Example |  |  |  |  |  | Comparative Example |  |  |  |  |  |
|---|---|---|---|---|---|---|---|---|---|---|---|---|---|
| Example No. |  | 21 | 22 | 23 | 24 | 25 | 26 | 9 | 10 | 11 | 12 | 13 | 14 |
| Photo-initiator composition (C) | BC | 10 mg | 0 | 0 | 10 mg | 0 | 0 | 10 mg | 10 mg | 0 | 0 | 0 | 0 |
|  | MOBC | 0 | 10 mg | 0 | 0 | 10 mg | 0 | 0 | 0 | 0 | 0 | 0 | 0 |
|  | DETC | 0 | 0 | 10 mg | 0 | 0 | 10 mg | 0 | 0 | 0 | 0 | 0 | 0 |
|  | Titanocene 1 | 100 mg | 100 mg | 100 mg | 100 mg | 100 mg | 100 mg | 0 | 0 | 100 mg | 100 mg | 100 mg | 100 mg |
|  | Oxime ester 1 | 100 mg | 100 mg | 100 mg | 100 mg | 100 mg | 100 mg | 100 mg | 100 mg | 0 | 0 | 100 mg | 100 mg |
| Additive | AZ | 0 | 0 | 0 | 20 mg | 20 mg | 20 mg | 0 | 20 mg | 0 | 20 mg | 0 | 20 mg |
| Evaluation | NFTAD (%) | 75 | 75 | 75 | 85 | 85 | 85 | 60 | 65 | 25 | 30 | 25 | 30 |
|  | Open diameter ($\mu$m) | 10 | 10 | 10 | 10 | 10 | 10 | 20 | 20 | 100 | 100 | 100 | 100 |
|  | Shape of pattern | Good | Good | Good | Good | Good | Good | Undercut | Undercut | Swollen | Swollen | Swollen | Swollen |

Note)
Oxime ester 1 = 1,3-diphenyl-1,2,3-propanetrion-2-(O-ethoxycarbonyl)oxime

What is claimed is:

1. A photosensitive composition comprising an addition polymerizable compound which is an ethylenically unsaturated compound having a boiling point of 100° C. or higher under 1 atmosphere, and a photoinitiator composition (B) comprising an N-aryl-α-amino acid of the formula:

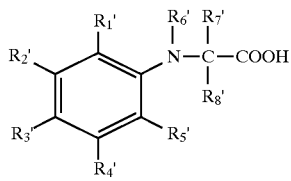

wherein $R_3'$ is an alkylsulfonyl group having 1 to 4 carbon atoms, $R_6'$ is an alkyl group having 1 to 12 carbon atoms, and $R^{1'}$, $R_2'$, $R_4'$, $R_5'$, $R_7'$ and $R_8'$ are hydrogen atoms, a 3-substituted coumarin compound of the formula:

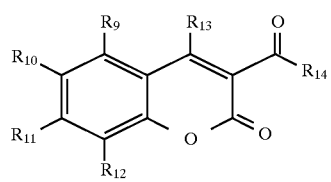

wherein $R_{11}$ is an amino group substituted with two alkyl groups having 1 to 5 carbon atoms, $R_{14}$ is a thienyl group; and $R_9$, $R_{10}$, $R_{12}$ and $R_{13}$ are hydrogen atoms, and a titanocene compound of the formula:

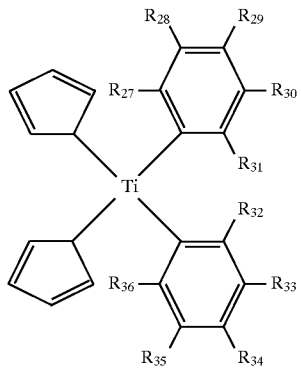

wherein $R_{27}$, $R_{31}$, $R_{32}$, and $R_{36}$ are halogen atoms, $R_{30}$ and $R_{35}$ are heterocyclic rings, wherein said heterocyclic ring may be bonded directly to a benzene ring or via an alkylene group having 1 to 12 carbon atoms, and may be non-substituted or substituted with at least one alkyl group having 1 to 12 carbon atoms, amino group, alkylamino group having 1 to 12 carbon atoms or alkoxy group having 1 to 12 carbon atoms; and $R_{28}$, $R_{29}$, $R_{33}$ and $R_{34}$ are hydrogen atoms.

2. A photosensitive composition, comprising an addition polymerizable compound which is an ethylenically unsaturated compound having a boiling point of 100° C. or higher under 1 atmosphere, and a photoinitiator composition (B) comprising N-(p-methylsulfonyl-phenyl)-N-methylglycine, 7-N,N-diethylamino-3-thienylcarbonyl-coumarin, and bis(cyclo-pentadienyl)-bis{2,6-difluoro-3-pyrrol-1-yl)phenyl}-titanium.

3. A photosensitive composition comprising an addition polymerizable compound having a boiling point of 100° C. or higher under 1 atmosphere, and a photoinitiator composition (B) comprises an N-aryl-α-amino acid of the formula:

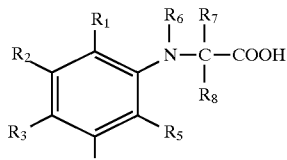

wherein $R_3$ is an alkylsulfonyl group having 1 to 4 carbon atoms; $R_6$ is an alkyl group having 1 to 12 carbon atoms; and $R_1$, $R_2$, $R_4$, $R_5$, $R_7$ and $R_8$ are hydrogen atoms, a 3-substituted coumarin compound of the formula:

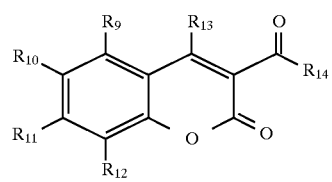

wherein $R_{11}$ is an amino group substituted with two alkyl groups having 1 to 5 carbon atoms; $R_{14}$ is a thienyl group; and $R_9$, $R_{10}$, $R_{12}$ and $R_{13}$ are hydrogen atoms, and a titanocene compound of the formula:

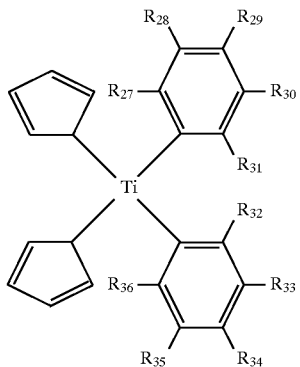

wherein $R_{27}$, $R_{31}$, $R_{32}$, and $R_{36}$ are halogen atoms; $R_{30}$ and $R_{35}$ are heterocyclic rings, wherein said heterocyclic ring may be bonded directly to a benzene ring or via an alkylene group having 1 to 12 carbon atoms, and may be non-substituted or substituted with at least one alkyl group having 1 to 12 carbon atoms, amino group, alkylamino group having 1 to 12 carbon atoms or alkoxy group having 1 to 12 carbon atoms; and $R_{28}$, $R_{29}$, $R_{33}$ and $R_{34}$ are hydrogen atoms.

4. A photosensitive composition comprising an addition polymerizable compound having a boiling point of 100° C. or higher under 1 atmosphere, and a photoinitiator composition (B) comprising N-(p-methylsulfonylphenyl)-N-methylglycine, 7-N,N-diethylamino-3-thienylcarbonyl-coumarin, and bis(cyclo-pentadienyl)-bis{2,6-difluoro-3-(pyrrol-1-yl)phenyl}-titanium.

* * * * *